United States Patent
Raring et al.

(10) Patent No.: US 8,259,769 B1
(45) Date of Patent: Sep. 4, 2012

(54) INTEGRATED TOTAL INTERNAL REFLECTORS FOR HIGH-GAIN LASER DIODES WITH HIGH QUALITY CLEAVED FACETS ON NONPOLAR/SEMIPOLAR GAN SUBSTRATES

(75) Inventors: James W. Raring, Goleta, CA (US); Daniel F. Feezell, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/502,058

(22) Filed: Jul. 13, 2009

Related U.S. Application Data (60) Provisional application No. 61/080,655, filed on Jul. 14, 2008.

(51) Int. Cl.
*H01S 5/00* (2006.01)

(52) U.S. Cl. .................. 372/44.011; 372/34.01; 372/93; 372/99

(58) Field of Classification Search ............. 372/43.011, 372/43.01, 93, 99
See application file for complete search history.

(56) References Cited

U.S. PATENT DOCUMENTS

| | | | |
|---|---|---|---|
| 4,341,592 A | 7/1982 | Shortes et al. | |
| 4,860,687 A | 8/1989 | Frijlink | |
| 4,911,102 A | 3/1990 | Manabe et al. | |
| 5,334,277 A | 8/1994 | Nakamura | |
| 5,366,953 A | 11/1994 | Char et al. | |
| 5,527,417 A | 6/1996 | Lida et al. | |
| 5,607,899 A | 3/1997 | Yoshida et al. | |
| 5,632,812 A | 5/1997 | Hirabayashi | |
| 5,696,389 A | 12/1997 | Ishikawa et al. | |

(Continued)

FOREIGN PATENT DOCUMENTS

JP 2007-173467 A 7/2007

OTHER PUBLICATIONS

Sizov et al., "500-nm Optical Gain Anisotropy of Semipolar (1122) InGaN Quantum Wells," 2009, Applied Physics Express, vol. 2, pp. 071001-1-071001-3.

(Continued)

*Primary Examiner* — Kinam Park
(74) *Attorney, Agent, or Firm* — Kilpatrick Townsend & Stockton LLP (57) ABSTRACT

A laser diode device operable at a one or more wavelength ranges. The device has a first waveguide provided on a non-polar or semipolar crystal plane of gallium containing material. In a specific embodiment, the first waveguide has a first gain characteristic and a first direction. In a specific embodiment, the first waveguide has a first end and a second end and a first length defined between the first end and the second end. The device has a second waveguide provided on a non-polar or semipolar crystal plane of gallium containing material. In a specific embodiment, the second waveguide has a second gain characteristic and a second direction. In a specific embodiment, the second waveguide has a first end, a second end, and a second length defined between the first end and the second end. In a specific embodiment, the second waveguide has the first end being coupled to the first end of the first waveguide. The second length is in a different direction from the second length. In a specific embodiment, the device has a cleaved region provided on the second end of the second waveguide, the cleaved region being perpendicular to the second direction of the second waveguide.

15 Claims, 5 Drawing Sheets

An example embodiment on semipolar (11-22) oriented GaN

U.S. PATENT DOCUMENTS

| | | | |
|---|---|---|---|
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,390,359 B2 | 6/2008 | Miyanaga et al. |
| 7,470,555 B2 | 12/2008 | Matsumura |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,749,326 B2 | 7/2010 | Kim et al. |
| 7,806,078 B2 | 10/2010 | Yoshida |
| 7,968,864 B2 | 6/2011 | Akita et al. |
| 8,017,932 B2 | 9/2011 | Okamoto et al. |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0247275 A1* | 12/2004 | Vakhshoori et al. .......... 385/129 |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0086916 A1 | 4/2007 | LeBoeuf et al. |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1* | 8/2008 | Nakamura et al. .............. 257/95 |
| 2008/0198881 A1* | 8/2008 | Farrell et al. ..................... 372/9 |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0285609 A1* | 11/2008 | Ohta et al. ............... 372/44.011 |
| 2008/0291961 A1 | 11/2008 | Kamikawa et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0309110 A1 | 12/2009 | Raring et al. |
| 2009/0309127 A1 | 12/2009 | Raring et al. |
| 2010/0001300 A1 | 1/2010 | Raring et al. |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0295054 A1 | 11/2010 | Okamoto et al. |
| 2010/0302464 A1 | 12/2010 | Raring et al. |
| 2010/0316075 A1 | 12/2010 | Raring et al. |
| 2010/0327291 A1 | 12/2010 | Preble et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0103418 A1 | 5/2011 | Hardy et al. |

OTHER PUBLICATIONS

Office action for U.S. Appl. No. 12/573,820 (Oct. 11, 2011).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/484,924 (Oct. 31, 2011).
Office action for U.S. Appl. No. 12/497,289 (Feb. 2, 2012).
Office action for U.S. Appl. No. 12/759,273 (Nov. 21, 2011).
Office action for U.S. Appl. No. 12/762,269 (Oct. 12, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).
Abare "Cleaved and Etched Facet Nitride Laser Diodes," IEEE Journal of Selected Topics in Quantum Electronics, Vol. 4, No. 3, pp. 505-509 (May 1998).
Asif Khan "Cleaved cavity optically pumped InGaN-GaN laser grown on spinel substrates," Appl. Phys. Lett. 69 (16), pp. 2418-2420 (Oct. 14, 1996).
Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells,",Journal of Applied Physics vol. 91, No. 12, pp. 9904-9908 (Jun. 2002).

Romanov "Strain-induced polarization in wurtzite III-nitride semipolar layers," Journal of Applied Physics 100, pp. 023522-1 through 023522-10 (Jul. 25, 2006).

Schoedl "Facet degradation of GaN heterostructure laser diodes," Journal of Applied Physics vol. 97, issue 12, pp. 123102-1 to 123102-8 (2005).

Aoki et al., 'InGaAs/InGaAsP MQW Electroabsorption Modulator Integrated With A DFB Laser Fabricated by Band-Gap Energy Control Selective Area MOCVD,' IEEE Journal of Quantum Electronics, vol. 29, 1993, pp. 2088-2096.

Asano et al., '100-mW Kink-Free Blue-Violet Laser Diodes With Low Aspect Ratio,' IEEE Journal of Quantum Electronics, vol. 39, No. 1, 2003, pp. 135-140.

Bernardini et al., 'Spontaneous Polarization and Piezoelectric Constants of III-V Nitrides,' Physical Review B, vol. 56, No. 16, 1997, pp. R10-024-R10-027.

Caneau et al., 'Studies on Selective OMVPE Of (Ga,ln)/(As,P),' Journal of Crystal Growth, vol. 124, 1992, pp. 243-248.

Chen et al., 'Growth and Optical Properties of Highly Uniform and Periodic InGaN Nanostructures,' Advanced Materials, vol. 19, 2007, pp. 1707-1710.

Funato et al., 'Blue, Green, and Amber InGaN/GaN Light-Emitting Diodes on Semipolar (1122) GaN Bulk Substrates,' Japanese Journal of Applied Physics, vol. 45, No. 26, 2006, pp. L659-L662.

Funato et al., 'Monolithic Polychromatic Light-Emitting Diodes Based on InGaN Microfacet Quantum Wells Toward Tailor-Made Solid-State Lighting,' Applied Physics Express, vol. 1, 2008, pp. 011106-1-011106-3.

Hiramatsu et al., 'Selective Area Growth and Epitaxial Lateral Overgrowth of GaN by Metalorganic Vapor Phase Epitaxy and Hydride Vapor Phase Epitaxy,' Materials Science and Engineering, vol. B59, 1999, pp. 104-111.

Kim et al., 'Improved Electroluminescence on Nonpolar m-Plane InGaN/GaN Qantum Well LEDs,' Rapid Research Letters, vol. 1, No. 3, 2007, pp. 125-127.

Kuramoto et al., 'Novel Ridge-Type InGaN Multiple-Quantum-Well Laser Diodes Fabricated by Selective Area Re-Growth on n-GaN Substrates,' Japanese Journal of Applied Physics, vol. 40, 2001, pp. L925-L927.

Nakamura et al., 'InGaN/Gan/AlGaN-Based Laser Diodes With Modulation-Doped Strained-Layer Superlattices Grown on an Epitaxially Laterally Overgrown GaN Substrate,' Applied Physics Letters, vol. 72, No. 2, 1998, pp. 211-213.

Nam et al., 'Lateral Epitaxial Overgrowth of GaN Films on SiO2 Areas Via Metalorganic Vapor Phase Epitaxy,' Journal of Electronic Materials, vol. 27, No. 4, 1998, pp. 233-237.

Okamoto et al., 'Continuous-Wave Operation of m-Plane InGaN Multiple Quantum Well Laser Diodes,' Japanese Journal of Applied Physics, vol. 46, No. 9, 2007, pp. L187-L189.

Okamoto et al., 'Pure Blue Laser Diodes Based on Nonpolar m-Plane Gallium Nitride With InGaN Waveguiding Layers,' Japanese Journal of Applied Physics, vol. 46, No. 35, 2007, pp. L820- L822.

Okubo, 'Nichia Develops Blue-Green Semiconductor Laser With 488 nm Wavelength,' http://techon.nikkeibp.co.jp/english/NEWS_EN/20080122/146009, 2008.

International Search Report of PCT Application No. PCT/US2009/047107, dated Sep. 29, 2009, 4 pages total.

International Search Report of PCT Application No. PCT/US2009/046786, dated May 13, 2010, 2 pages total.

International Search Report of PCT Application No. PCT/US2009/52611, dated Sep. 29, 2009, 3 pages total.

International Search Report & Written Opinion of PCT Application No. PCT/US2010/030939, dated Jun. 16, 2010, 9 pages total.

International Search Report & Written Opinion of PCT Application No. PCT/US2010/049172, dated Nov. 17, 2010, 7 pages total.

International Search Report of PCT Application No. PCT/US2011/037792, dated Sep. 8, 2011, 2 pages total.

Purvis, 'Changing the Crystal Face of Gallium Nitride,' The Advance Semiconductor Magazine, vol. 18, No. 8, 2005, pp. 1-3.

Sato et al., 'High Power and High Efficiency Green Light Emitting Diode on Free-Standing Semipolar (1122) Bulk GaN Substrate,' Physica Status Solidi (RRL), vol. 1, No. 4, 2007, pp. 162-164.

Sato et al., 'Optical Properties of Yellow Light-Emitting Diodes Grown on Semipolar (1122) Bulk GaN Substrate,' Applied Physics LetterS, vol. 92, No. 22, 2008, pp. 221110-1-221110-3.

Schmidt et al., 'Demonstration of Nonpolar m-Plane InGaN/GaN Laser Diodes,' Japanese Journal of Applied Physics, vol. 46, No. 9, 2007, pp. L190-L191.

Uchida et al., 'Recent Progress in High-Power Blue-Violet Lasers,' IEEE Journal of Selected Topics in Quantum Electronics, vol. 9, No. 5, 2003, pp. 1252-1259.

Waltereit et al., 'Nitride Semiconductors Free of Electrostatic Fields for Efficient White Light-Emitting Diodes,' Letters to Nature: International Weekly Journal of Science, vol. 406, 2000, pp. 865867.

Yamaguchi, 'Anisotropic Optical Matrix Elements in Strained GaN-Quantum Wells With Various Substrate Orientations,' Physica Status Solidi (PSS), vol. 5, No. 6, 2008, pp. 2329-2332.

Yoshizumi et al., 'Continuous-Wave Operation of 520 nm Green InGaN-Based Laser Diodes on Semi- Polar {2021} GaN Substrates,' Applied Physics Express, vol. 2, 2009, pp. 092101-1-092101-3.

Yu et al., 'Multiple Wavelength Emission From Semipolar InGaN/GaN Quantum Wells Selectively Grown by Mocvd,' Optical Society of America, 2007, pp. 1-2.

Zhong et al., 'High Power and High Efficiency Blue Light Emitting Diode on Freestanding Semipolar (1011) Bulk GaN Substrate,' Applied Physics Letter, vol. 90, No. 23, 2007, pp. 233504-1233504-3.

USPTO Office Action for U.S. Appl. No. 12/573,820 dated Oct. 11, 2011.

* cited by examiner

An example embodiment on semipolar (11-22) oriented GaN

An example embodiment on semipolar (11-22) oriented GaN

FIG. 2

An example embodiment on semipolar (11-22) oriented GaN

An example embodiment on nonpolar (10-10) oriented GaN

FIG. 5

An example embodiment on nonpolar (10-10) oriented GaN

INTEGRATED TOTAL INTERNAL REFLECTORS FOR HIGH-GAIN LASER DIODES WITH HIGH QUALITY CLEAVED FACETS ON NONPOLAR/SEMIPOLAR GAN SUBSTRATES

CROSS-REFERENCES TO RELATED APPLICATIONS

This application claims priority to U.S. Provisional Patent Application Ser. No. 61/080,655 filed Jul. 14, 2008 entitled INTEGRATED TOTAL INTERNAL REFLECTORS FOR HIGH-GAIN LASER DIODES WITH HIGH QUALITY CLEAVED FACETS ON NONPOLAR/SEMIPOLAR GaN SUBSTRATES by inventors JAMES W. RARING and DANIEL F. FEEZELL, commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to lighting techniques. More specifically, the present invention provides a method and device using multi-directional laser cavities having improved facets. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the lightbulb. The conventional lightbulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

According to the present invention, techniques related to lighting are provided. More specifically, the present invention provides a method and device using multi-directional laser cavities having improved facets. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In a specific embodiment, the present invention provides a laser diode device operable at a one or more wavelength ranges. The device has a first waveguide provided on a nonpolar or semipolar crystal plane of gallium containing material. In a specific embodiment, the first waveguide has a first gain characteristic and a first direction. In a specific embodiment, the first waveguide has a first end and a second end and a first length defined between the first end and the second end. The device has a second waveguide provided on a non-polar or semipolar crystal plane of gallium containing material. In a specific embodiment, the second waveguide has a second gain characteristic and a second direction. In a specific embodiment, the second waveguide has a first end, a second end, and a second length defined between the first end and the second end. In a specific embodiment, the second waveguide has the first end being coupled to the first end of the first waveguide. The second length is in a different direction from the second length. In a specific embodiment, the device has a cleaved region provided on the second end of the second waveguide, the cleaved region being substantially perpendicular to the second direction of the second waveguide. In a preferred embodiment, the first and second waveguides are continuous, are formed as a single continuous waveguide structure, and are formed together during manufacture of the waveguides. Of course, there can be other variations, modifications, and alternatives.

In yet an alternative specific embodiment, the present invention provides an optical device, e.g., laser. The device includes a gallium and nitrogen containing material having a surface region, which is characterized by a semipolar (11-22) surface orientation. The device also has a first waveguide region configured in a first direction, which is a projection of a c-direction or [-1-123] overlying the surface region of the gallium and nitrogen containing material in a specific embodiment. The device also has a second waveguide region coupled to the first waveguide region and is configured in a second direction overlying the surface region of the gallium and nitrogen containing material. In a preferred embodiment, the second direction is different from the first direction and substantially parallel to the m-direction. In a preferred embodiment, the first and second waveguide regions are continuous, are formed as a single continuous waveguide structure, and are formed together during manufacture of the waveguides. Of course, there can be other variations, modifications, and alternatives.

In an alternative specific embodiment, the present invention provides an optical device, e.g., laser. The device includes a gallium and nitrogen containing material having a surface region, which is characterized by a non-polar surface orientation. The device also has a first waveguide region configured in a first direction, which is in a c-direction overlying the surface region of the gallium and nitrogen containing material. The device also has a second waveguide region coupled to the first waveguide region and configured in a second direction overlying the surface region of the gallium and nitrogen containing material. In a preferred embodiment, the second direction is different from the first direction. In a preferred embodiment, the first and second waveguide regions are continuous, are formed as a single continuous waveguide structure, and are formed together during manufacture of the waveguides. Of course, there can be other variations, modifications, and alternatives.

In one or more embodiments, the present structure and method also include waveguide structures having quantum well configurations made using epitaxial materials of gallium and nitrogen containing materials. Such configurations are described more particularly below.

One or more benefits may be achieved using one or more of the specific embodiments. As an example, the present device and method provides for higher yields over conventional techniques in fabricating laser devices. In other embodiments, the present method and resulting structure are easier to form by way of a preferential cleaving plane in a gallium nitride containing crystalline material. In one or more preferred embodiments, the present method and structure provide for improved an improved gain characteristic for a laser device using a waveguide and associated cavity oriented in a first direction and an improved or desirable cleave characteristic for forming cleaved facets using a waveguide oriented in a second direction, which is different from the first direction. In one or more embodiments, the present method and structure also takes advantage of the anisotropic characteristic of one or more electromagnetic emissions from the semipolar and/or nonpolar oriented gallium nitride material configured as an optical device. As an example, a description of anisotropy and waveguide gain can be found in D. S. Sizov et al. "500-nm Optical Gain Anisotropy of Semipolar (11-22) InGaN Quantum Wells", *Applied Physics Express*, No. 2, 071001, 2009, which is hereby incorporated by reference for all purposes. Depending upon the embodiment, one or more of these benefits can be achieved. These and other benefits are further described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

According to the present invention, techniques related to lighting are provided. More specifically, the present invention provides a method and device using multi-directional laser cavities having improved facets. Merely by way of example, the invention can be applied to applications such as full color laser display systems, white lighting, multi-colored lighting, general illumination, decorative lighting, automotive and aircraft lamps, street lights, lighting for plant growth, indicator lights, lighting for flat panel displays, other optoelectronic devices, and the like.

In a specific embodiment, epitaxial layers grown on nonpolar and semipolar crystal orientations exhibit gain anisotropy where the amount of available gain the laser cavity is dependent on at least the orientation or direction of the cavity itself. For improved laser performance, it is desirable to maximize the gain in the cavity. However, the laser should also possess high-quality mirrors for best or improved performance. The quality of the mirror is characterized by the smoothness and verticality, which ultimately dictate the reflectivity, and possibly other factors. Furthermore, for purposes of manufacturing, it is desirable to have a mirror fabrication technique that is straightforward, fast, and relatively inexpensive. A technique to realize Fabry Perot laser mirrors is to use high-quality cleaved facets, which are made using cleaving techniques. Unfortunately, we learned that the ease (and quality) of which the cleaved mirrors are formed are dependant upon the crystal orientation of the cleave plane(s). Some crystallographic orientations do not readily cleave and do not easily yield high quality mirrors. Conventional laser diodes orient the gain providing laser stripe orthogonal to the cleaved mirrors. However, on nonpolar and semipolar GaN crystal planes with anisotropic gain characteristics, such configurations will not always provide the desirable cleave plane for mirrors and maximum gain in the laser cavity. These and other limitations may be overcome by way of the present method and structures, which are more fully described below.

As used herein, the term gallium nitride substrate material is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other meanings understood by one of ordinary skill in the art, including modifications, alternatives, and variations.

Additionally, the present structures and method refer to non-polar or semipolar crystal orientations for gallium and nitrogen containing materials according to one or more embodiments. In a specific embodiment, the non-polar crystal orientation may include the m-plane (10-10) non-polar orientation, but can be one or more in the family of [1-100] non-polar crystal orientations. In a specific embodiment, the semipolar crystal orientation may include (11-22) semipolar, but can be one or more in the same family of semipolar crystal orientations. In one or more other embodiments, the semipolar crystal orientation may include a direction toward projection of c-plane, as an example [−1-123] semipolar crystal orientations, or other crystal orientations within the same family. Other variations such as the use of the semipolar crystal plane (10-1-1) or like can also exist. In other embodiments, the non-polar or semipolar orientations may have slight offsets, misorientations, or miscuts, or the like, including combinations. In a specific embodiment, the slight offsets can include any and all orientations within +/−5 or 10 degrees or more from any of the primary planes listed herein or outside of the specification. Of course, there can be other variations, modifications, and alternatives.

In a preferred embodiment, the present invention provides for a structure and method to orient the laser strip for maximum gain in one direction and then redirect the light within the cavity in another direction where high quality cleaved facets can be achieved orthogonal to the propagating light. In one or more embodiment, the other direction can also provide gain in the laser cavity. In one or more embodiments, the maximum gain direction may be normal to the other direction or be configured in almost any other spatial relationship, including use of intermediary laser cavity regions. Of course, there can be other variations, modifications, and alternatives.

In a specific embodiment, the present invention provides a method to orient laser stripes on nonpolar or semipolar substrates. In a preferred embodiment, the method orients laser stripes on the substrates for maximized gain while simultaneously allowing for cleaved facets to be formed in a crystallographically favorable orientation. Theoretical modeling predicts maximum gain for laser diodes oriented in the c-direction on nonpolar (m-plane) and oriented in the projection of the c-direction on semipolar GaN crystal orientations. In the case of the semipolar (11-22) crystal orientation, modeling predicts higher gain for light propagating in the [−1-123] direction, which may be referred to herein as the projection of the c-direction when discussing the semipolar (11-22) surface plane orientation, and all reported laser demonstrations to date have been configured this way. We have also discovered that there is no desirable cleavage plane normal to laser cavities oriented in the projection of the c-direction according to one or more embodiments. However, we have discovered that stripes oriented in the m-direction could benefit from the nice cleavage plane on the m-face. As a specific example, we demonstrated a cleave on the m-face, which has smooth and desirable features according to a specific embodiment. The m-face cleave is shown below in reference to FIG. 1A, but is not limited thereto.

Figure 1:
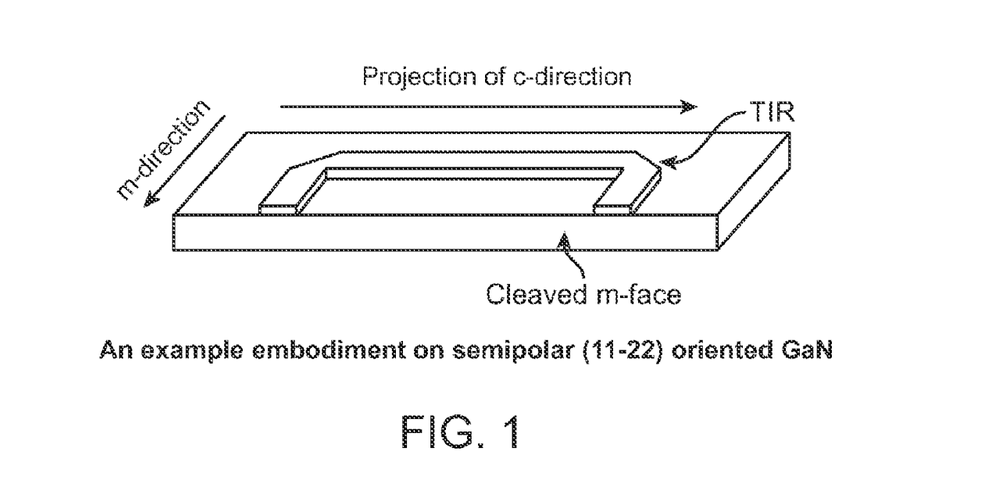
FIGS. 1-3 are simplified diagrams of optical devices according to embodiments of the present invention.
Figure 1A:
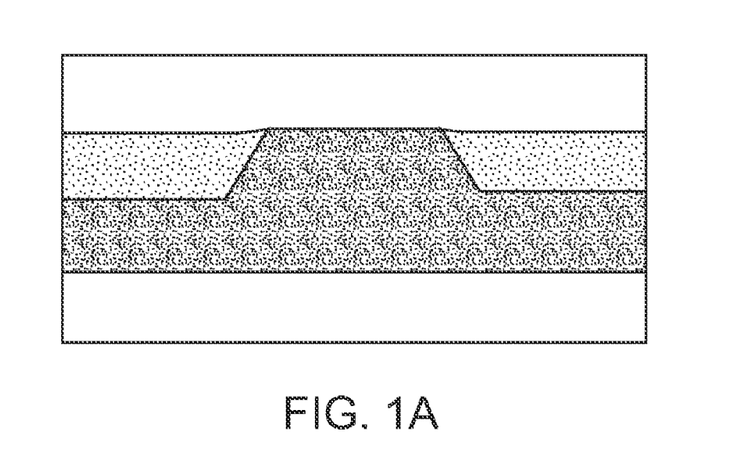
FIG. 1A is a photograph of an m-facet of a gallium and nitrogen containing substrate according to an embodiment of the present invention.

FIG. 1A is a cross-sectional image of an m-face cleave according to an embodiment of the present invention. This image is merely an example, which should not unduly limit the scope of the claims herein. One of ordinary skill in the art would recognize other variations, modifications, and alternatives. As shown, the m-direction cleaved facet is smooth and provides a suitable mirror surface. In a specific embodiment, one mirror surface has a reflectivity of about 99% and greater and the other mirror surface has a reflectivity of 65% and greater, but could be others. An example of a way to perform a cleave on a gallium nitride containing material is found in U.S. Provisional Application Ser. No. 61/168,926, entitled OPTICAL DEVICE STRUCTURE USING GaN SUBSTRATES FOR LASER APPLICATIONS by DANIEL F. FEEZELL et al., hereby incorporated by reference herein in its entirety.

Clearly, on (11-22) it would be desirable in a laser diode to exploit the high gain characteristic of projection of c-oriented laser stripes along with the cleavage properties of mirrors on the m-face. However, conventional laser diode structures with the mirrors oriented normal to the primary gain laser stripe do not facilitate this because the higher gain would be realized in the projection of the c-direction, but we have discovered higher quality cleaves on the m-plane, which is not orthogonal to the projection of the c-direction.

In the case of the nonpolar (10-10) crystal orientation the gain anisotropy theory has been verified experimentally in laser diodes where laser stripes along the c-direction have demonstrated reduced threshold current densities relative devices oriented in the a-direction. It has also been shown that such substrates will preferentially cleave along the a-plane of the crystal making this plane optimum for use as the laser mirror in cleave facet devices. However, since the a-face is oriented parallel to c-direction, these crystallographically dependent characteristics create great difficulty for the fabrication of conventional cleaved facet diode lasers with both optimized gain and high quality cleaved facets.

Figure 2:
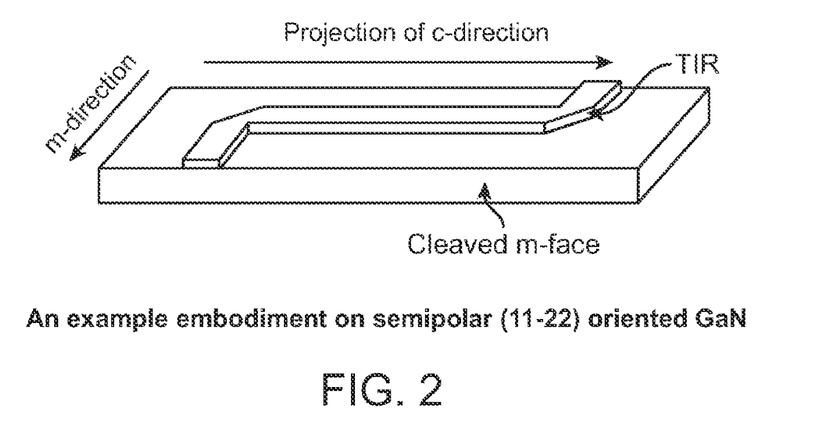
Figure 3:
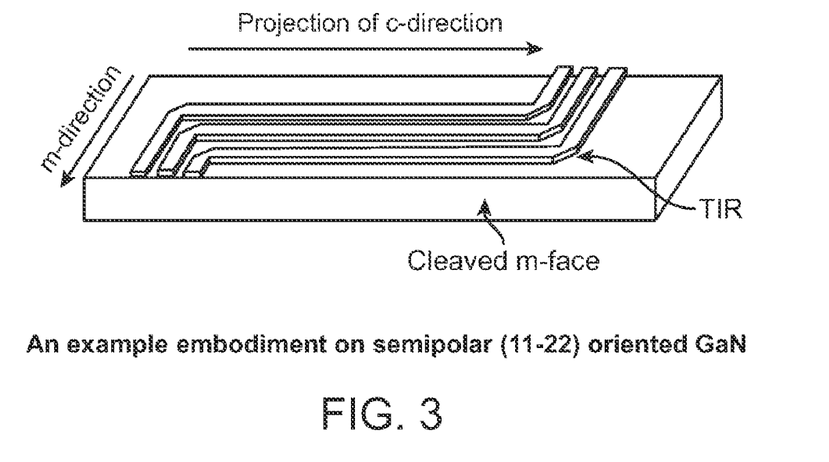

Here, we propose to integrate total internal reflectors (TIR) within the laser gain cavity on nonpolar or semipolar GaN such that the laser stripe can be oriented for maximum gain and a crystal plane that is not oriented orthogonal to the primary gain stripe can be used for the mirrors such that high quality cleaved facets can be used in the laser. On semipolar (11-22) oriented GaN, a majority of the laser stripe length will be directed substantially along the projection of c-direction to provide the laser with high gain. At the ends of the cavity there will be TIR mirrors to redirect the cavity substantially in the m-direction such that high quality m-plane cleaved facet mirrors can be implemented. Put simply, at the ends of the c-projection oriented laser cavity, the light will be turned approximately 90 degrees such that the waveguide will be normally incident to the m-plane. A specific embodiment of this concept is shown in FIG. 1 where light emission from both ends of the cavity would exit the chip from the same m-face. This laser geometry could also be arranged with the TIR mirrors directing the light in opposite directions such that there would be emission from two m-faces of the chip as shown in FIG. 2. To form high power laser arrays, these devices could be arranged in a parallel architecture such that there were multiple output waveguides adjacent to one another on the edge of the chip as shown in FIG. 3.

In a specific embodiment, the gallium nitride substrate member is a bulk GaN substrate characterized by having a semipolar crystalline surface region, but can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$. Of course, there can be other variations, modifications, and alternatives.

In a specific embodiment, the device has a laser stripe region formed overlying a portion of the semipolar crystalline orientation surface region. In a specific embodiment, the laser stripe region is characterized by a cavity orientation is substantially parallel to a projection in the c-direction, as noted, but can be other configurations. In a specific embodiment, the laser stripe region has a first end and a second end, as shown above. In a specific embodiment, the first end is coupled to a second laser stripe region and the second end is coupled to a third laser stripe region, but can be other configurations. Of course, there can be other variations, modifications, and alternatives.

In a preferred embodiment, the device has a first cleaved m-face facet and a second cleaved m-face facet, each of which is laser stripe region. In one or more embodiments, the first cleaved m facet is not directly facing the second cleaved m facet. Mirror surfaces are formed on each of the cleaved surfaces. The first cleaved m-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating. Of course, there can be other variations, modifications, and alternatives.

Also in a preferred embodiment, the second cleaved m-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating. Of course, there can be other variations, modifications, and alternatives.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art. Further details of the present device can be found throughout the present specification and more particularly below.

Figure 4:
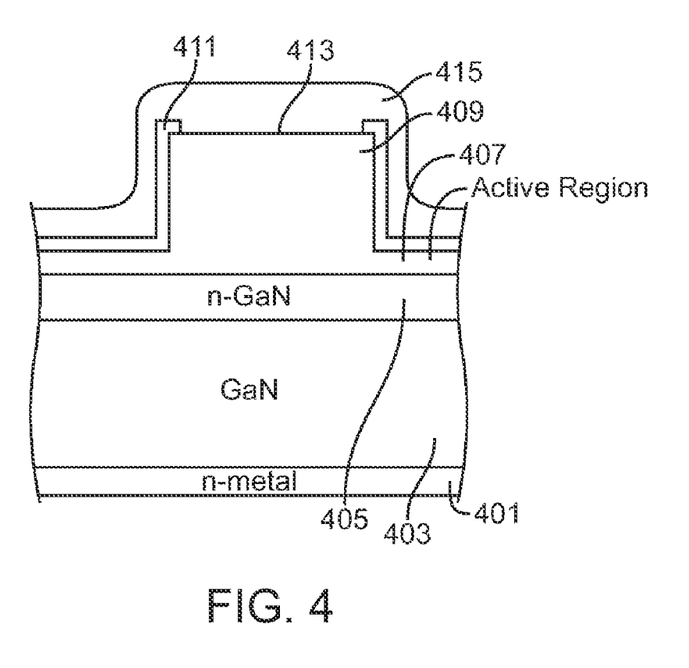
FIG. 4 is a simplified cross-sectional diagram of an optical device according to alternative embodiments of the present invention.

FIG. 4 is a detailed cross-sectional view of a laser device 400 fabricated on a semipolar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 403, which has an underlying n-type metal back contact region 401. In a specific embodiment, the metal back contact region is made of a suitable material such as those noted below and others. Further details of the contact region can be found throughout the present specification and more particularly below.

In a specific embodiment, the device also has an overlying n-type gallium nitride layer 405, an active region 407, and an overlying p-type gallium nitride layer structured as a laser stripe region 409. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u, v, u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 409. In a specific embodiment, the laser stripe and TIR mirrors are provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 413 contact region. In a specific embodiment, the dielectric region is an oxide such as silicon dioxide or silicon nitride, but can be others. The contact region is coupled to an overlying metal layer 415. The overlying metal layer is a multilayered structure containing gold and platinum (Pt/Au), but can be others. Of course, there can be other variations, modifications, and alternatives.

In a specific embodiment, the laser device has active region 407. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN, InGaN, or InAlGaN barrier layers. In other embodiments, the well layers and barrier layers comprise $Al_wIn_xGa_{1-w-x}N$ and $Al_yIn_zGa_{1-y-z}N$, respectively, where $0≦w, x, y, z, w+x, y+z≦1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0≦s, t, s+t≦1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure, which can be a p-type doped $Al_qIn_rGa_{1-q-r}N$, where $0≦q, r, q+r≦1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 413 contact region. In a specific embodiment, the dielectric region is an oxide such as silicon dioxide, but can be others. Of course, there can be other variations, modifications, and alternatives.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives. A further example of the present laser device fabrication process and structure can be found in "OPTICAL DEVICE STRUCTURE USING MISCUT GaN SUBSTRATES FOR LASER APPLICATIONS," in the names of JAMES W. RARING et al., which is listed under U.S. Provisional Application Ser. No. 61/164,409 filed Mar. 28, 2009, commonly assigned, and hereby incorporated by reference herein in its entirety.

Since lasers fabricated on nonpolar/semipolar GaN substrates demonstrate a polarization gain dependence on laser stripe direction, such devices could be used to achieve desired polarization ratios of the output radiation. That is, the relative length of the gain sections in the m-direction and projection of c-direction can be set to achieve a designed polarization ratio. TIR mirrors have been demonstrated in conventional III-V laser diodes with very low loss and relatively easy fabrication. Our invention should not exclude any of the many laser fabrication sequences that could be used to achieve this laser geometry, such as using various stripe or TIR fabrication processes.

Figure 5:
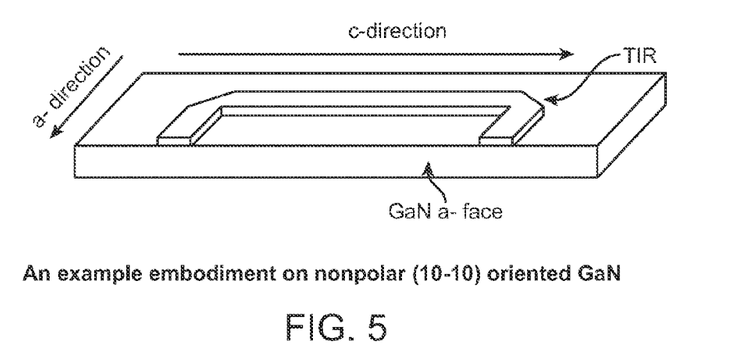
FIGS. 5-7 are simplified diagrams of optical devices according to alternative embodiments of the present invention.
Figure 6:
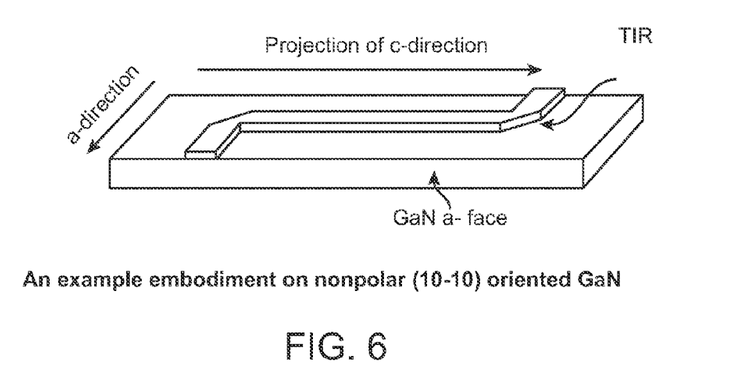
Figure 7:
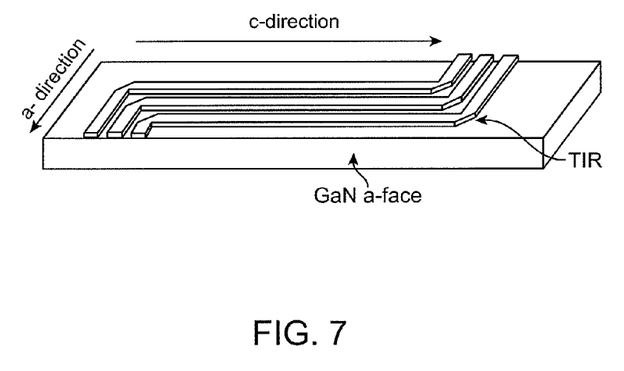

On nonpolar (10-10) GaN we propose to integrate total internal reflectors (TIR) within the laser gain cavity such that the stripe will be oriented in both the c- and a-directions. In this configuration a great majority of the stripe length will be directed along the c-direction to provide the laser with high gain. At the ends of the cavity there will be TIR mirrors to turn the cavity in the a-direction such that high quality a-plane cleaved facet mirrors can be implemented. Put simply, at the ends of the c-oriented laser cavity, the light will be turned 90 degrees such that the waveguide will be normally incident to the a-plane. One embodiment of this concept is shown in FIG. 5 where light emission from both ends of the cavity would exit the chip from the same side. This laser geometry could also be arranged with the TIR mirrors directing the light in opposite directions such that there would be emission from two sides of the chip as shown in FIG. 6. To form high power laser arrays, these devices could be arranged in a parallel architecture such that there were multiple output waveguides adjacent to one another on the edge of the chip as shown in FIG. 7.

Since lasers fabricated on nonpolar/semipolar GaN substrates demonstrate a polarization gain dependence on laser stripe direction, such devices could be used to achieve desired polarization ratios of the output radiation. That is, the relative length of the gain sections in the a-direction and c-direction can be set to achieve a designed polarization ratio. TIR mirrors have been demonstrated in conventional III-V laser diodes with very low loss and relatively easy fabrication. Our invention should not exclude any of the many laser fabrication sequences that could be used to achieve this laser geometry, such as using various stripe or TIR fabrication processes.

In a specific embodiment, the present method and devices can be formed on or from bulk crystalline GaN substrate materials having epitaxially grown films. The GaN materials can be associated with any Group III-nitride based materials including GaN, InGaN, AlGaN, InAlGaN or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero) according to one or more embodiments. Of course, there can be other variations, modifications, and alternatives.

Although the above has been described in terms of specific embodiments, other variations, modifications, and alternatives may exist. As an example, one or more waveguides are coupled to each other using mirrors or other reflective surfaces, such as TIR surfaces. Other embodiments may use any technique such as waveguide bends, multi-mode interferometers, or waveguide coupling schemes to reorient or redirect electromagnetic radiation from one of the first waveguides to at least one of more other waveguides. In a specific embodiment, two or more waveguides are configured to a maximum gain waveguide to reorient the electromagnetic radiation. Other embodiments may include other spatial arrangements using any combinations of waveguide shapes, sizes, spatial orientations, and spatial arrangements. Of course, there can be other variations, modifications, and alternatives.

While the above is a full description of the specific embodiments, various modifications, alternative constructions and equivalents may be used. As an example, the device can include any combination of elements described above, as well as outside of the present specification. Also, the gain characteristic can be no gain, some gain, or negative gain (loss) according to one or more embodiments. Therefore, the above description and illustrations should not be taken as limiting the scope of the present invention which is defined by the appended claims.

What is claimed is:

1. A gallium and nitrogen semipolar substrate having a laser diode thereon, the laser diode comprising:
   a first waveguide section provided on the semipolar substrate and extending in a projection of a c-direction of the semipolar substrate, the first waveguide section having a first gain characteristic and having a first end and a second end;
   a second waveguide section provided on the semipolar substrate and extending in an m-direction of the semipolar substrate and substantially perpendicular to the first waveguide section, the second waveguide section having a second gain characteristic and extending between the first end of the first waveguide section and a first cleaved m face which is substantially perpendicular to the m-direction;
   a first total internal reflection surface at the first end of the first waveguide section to transmit substantially all light between the first waveguide section and the second waveguide;
   a third waveguide section provided on the semipolar substrate and extending in an m-direction substantially perpendicular to the first waveguide section, the third waveguide section also having a second gain characteristic and extending between the second end of the first waveguide section, and a second cleaved m face which is substantially perpendicular to the m-direction; and
   wherein the combination of the first waveguide section, the second waveguide section, the third waveguide section, the first cleaved face and the second cleaved face provide the laser diode.

2. A laser diode as in claim 1 wherein the second end of the first waveguide section provides a second total internal reflection surface to transmit essentially all light between the first waveguide and the third waveguide.

3. A laser diode as in claim 2 wherein the first cleaved m face and the second cleaved m face are parallel to each other and spaced apart by a width of the semipolar substrate.

4. A laser diode as in claim 2 wherein the first cleaved m face and the second cleaved m face are in a common plane with each other.

5. The laser diode of claim 1 wherein the first gain characteristic is larger than the second gain characteristic.

6. The laser diode of claim 1 wherein the first end and the second end are separated by at least about 100 microns.

7. The laser diode of claim 1 wherein the first end and the second end are separated by at least about 400 microns.

8. The laser diode of claim 1 wherein the first end and the first cleaved m face are separated by at least about 5 microns.

9. The laser diode of claim 1 wherein the first end and the first cleaved m face are separated by at least about 50 microns.

10. The laser diode of claim 1 wherein the semipolar substrate has a (11-22) surface orientation.

11. The laser diode of claim 1 wherein the first waveguide section extends in a [−1-123] direction.

12. The laser diode of claim 1 wherein the cleaved m face has a surface roughness of less than about 5 nm.

13. A method for fabricating a laser diode comprising:
   providing a gallium and nitrogen containing substrate having a surface region characterized by a semipolar surface orientation; and
   forming a multi-directional waveguide structure having at least:
      a first waveguide region configured in a projection of a c-direction;
      a second waveguide region coupled to the first waveguide region by a first surface having total internal reflection, the second waveguide region extending perpendicular to the first waveguide region in an m-direction from the first surface to a first cleaved m-face; and
      a third waveguide region coupled to the first waveguide region by a second surface having total internal reflection, the third waveguide region extending perpendicular to the first waveguide region in an m-direction from the second surface to a second cleaved m-face.

14. A method as in claim 13 wherein the c-direction is [−1-123].

15. The laser diode of claim 1 wherein the projection of the c-direction is the direction providing high gain for the laser diode.

* * * * *